United States Patent

Reis et al.

[11] Patent Number: 5,870,937
[45] Date of Patent: Feb. 16, 1999

[54] VACUUM FIXTURE AND METHOD FOR DIMENSIONING AND MANIPULATING MATERIALS

[75] Inventors: Bradley E. Reis; Steven C. Hoover, both of Wilmington, Del.; Keith D. Adkins, Elkton, Md.

[73] Assignee: W. L. Gore & Associates, Inc., Newark, Del.

[21] Appl. No.: 803,786

[22] Filed: Feb. 24, 1997

Related U.S. Application Data

[62] Division of Ser. No. 515,757, Aug. 15, 1995, Pat. No. 5,660,380.

[51] Int. Cl.⁶ ............................................... B26D 7/08
[52] U.S. Cl. ........................ 83/24; 83/27; 83/98; 83/100
[58] Field of Search ............................. 83/23–24, 27, 83/55, 98, 100, 123

[56] References Cited

U.S. PATENT DOCUMENTS

| | | |
|---|---|---|
| 687,463 | 11/1901 | Speight . |
| 1,823,501 | 9/1931 | Messinger, Jr. . |
| 2,240,139 | 4/1941 | Kaailau . |
| 2,463,455 | 3/1949 | Dann ........................................ 164/32 |
| 2,477,572 | 8/1949 | Blasak . |
| 3,217,574 | 11/1965 | Nauta et al. . |
| 3,550,494 | 12/1970 | Adams . |
| 3,555,949 | 1/1971 | Treff . |
| 3,559,518 | 2/1971 | Domka . |
| 3,570,345 | 3/1971 | Spengler ................................. 83/128 |
| 3,661,683 | 5/1972 | Engel et al. . |
| 3,766,814 | 10/1973 | Kesten . |
| 3,850,064 | 11/1974 | Dwyer ..................................... 83/124 |
| 3,953,566 | 4/1976 | Gore ........................................ 264/288 |
| 3,962,153 | 6/1976 | Gore ........................................ 260/2.5 |
| 4,096,227 | 6/1978 | Gore ........................................ 264/210 |
| 4,187,390 | 2/1980 | Gore ........................................ 174/102 |
| 4,426,059 | 1/1984 | Mort . |
| 4,444,075 | 4/1984 | Mulry . |
| 4,444,078 | 4/1984 | Pearl . |
| 4,505,770 | 3/1985 | Larimore . |
| 4,558,619 | 12/1985 | Caumont . |
| 4,561,642 | 12/1985 | Parque . |
| 4,628,780 | 12/1986 | Hicks . |
| 4,913,015 | 4/1990 | Tone ........................................ 83/100 |
| 4,944,822 | 7/1990 | Ishikawa et al. . |
| 4,975,311 | 12/1990 | Lindgren . |
| 4,985,296 | 1/1991 | Mortimer ................................ 428/220 |
| 5,141,212 | 8/1992 | Beeding . |
| 5,179,882 | 1/1993 | Takeuchi et al. ......................... 83/125 |
| 5,277,093 | 1/1994 | Kinta ....................................... 83/100 |
| 5,286,568 | 2/1994 | Bacino et al. ........................... 428/422 |
| 5,316,255 | 5/1994 | Marcusen . |
| 5,332,204 | 7/1994 | Puppin . |
| 5,376,326 | 12/1994 | Medney et al. . |
| 5,386,751 | 2/1995 | Dylla et al. ................................. 83/18 |
| 5,458,719 | 10/1995 | Pall et al. . |
| 5,472,543 | 12/1995 | Yokajity . |
| 5,536,342 | 7/1996 | Reis ......................................... 156/64 |
| 5,636,559 | 6/1997 | Smithwick, Jr. et al. ................ 83/116 |

FOREIGN PATENT DOCUMENTS

| | | |
|---|---|---|
| 3309555 | 9/1984 | Germany . |
| 256952 | 5/1988 | Germany . |
| 103327 | 6/1982 | Japan . |
| 104220 | 6/1982 | Japan . |
| 201736 | 11/1984 | Japan . |
| 239621 | 9/1990 | Japan . |
| 1044698 | 10/1966 | United Kingdom . |
| 2120141 | 11/1983 | United Kingdom . |

OTHER PUBLICATIONS

"Rotating Vacuum Holding Fixture", W. E. Miligan IBM Technical Disclosure Bulletin, Mar., 1971.

*Primary Examiner*—Rinaldi I. Rada
*Assistant Examiner*—T. Anthony Vaughn
*Attorney, Agent, or Firm*—Victor M. Genco, Jr.

[57] ABSTRACT

A method and apparatus is provided for dimensioning and manipulating a patterned material by selectively applying a vacuum and/or positive pressure to the patterned material.

5 Claims, 7 Drawing Sheets

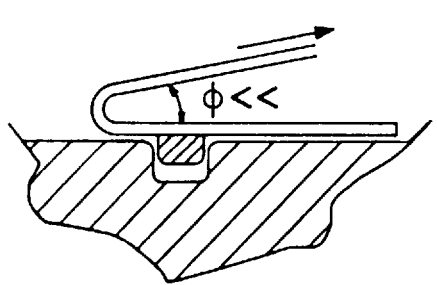
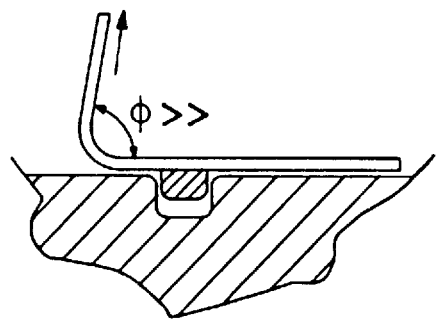
FIG. 9    FIG. 10
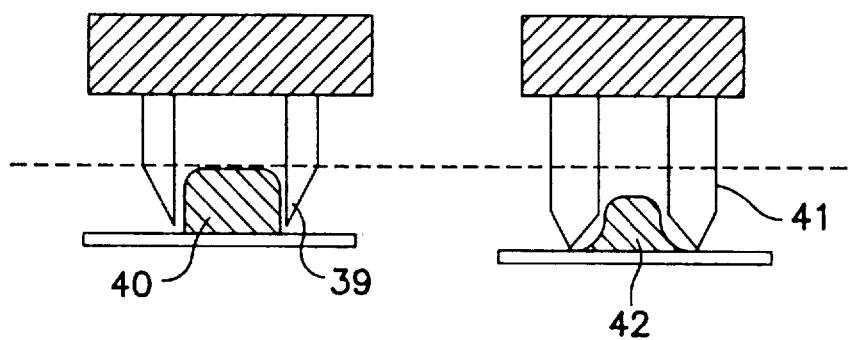
FIG. 12a    FIG. 12b

VACUUM FIXTURE AND METHOD FOR DIMENSIONING AND MANIPULATING MATERIALS

RELATED APPLICATIONS

This application is a divisional application of U.S. patent application Ser. No. 08/515,757, to Reis et al., filed Aug. 15, 1995, now U.S. Pat. No. 5,660,380.

FIELD OF THE INVENTION

The invention relates to an apparatus for accurately dimensioning and manipulating materials, such as but not limited to plastics, rubbers, cured adhesives, cured epoxies, metals, woven and non-woven materials, foils, cardboard, gels or caulks, grease-impregnated substrates, or tapes, for example.

BACKGROUND OF THE INVENTION

Modern industrial processes often require exact placement of die-cut, slit, formed or molded patterns which are intricately-shaped, or have thin or narrow segments. Such patterns are often made of metals, foils, cured epoxies, or gasket materials. For example, in the manufacture of personal communication devices (e.g., cellular phones or pagers) extremely intricately shaped electromagnetic interference (EMI) gasket materials must be produced, manipulated, and installed into such devices to exacting tolerances. Heretofore, such process steps have been tedious, costly, and laborious.

Previously, in the field of EMI shielding gaskets, V-shaped strips of silicone-filled elastomers have been hand placed onto a molded or machined rib, or into a predetermined groove on a circuit board cover. Also, die-cut metalized fabrics wrapped over foam strips with an integral adhesive, and die-cut patterns of oriented metal wire embedded in a support substrate have been used. Typically, these patterns are hand-cut, separately packaged and stored. Thereafter, these patterns are hand-applied and oriented visually onto a substrate by an end user. Because of the difficulty in manipulating these delicate, small and intricate patterns by hand, widths of the gasket are often forced to be greater than desired. This is undesirable considering the high value of space on today's tightly-packed printed circuit boards. Also, the manipulation of these gaskets is tedious, ergonomically hazardous, and therefore, quite costly, since it almost always is extremely time-consuming. In some cases, installation times can exceed several minutes per part, depending upon the complexity of the part.

One suggested attempt generally known in the art is directed at increasing the efficiency of these manufacturing processes and teaches semi-automatically dispensing liquid-gasket compounds onto a desired substrate. However, because such liquid-gasket compounds require a curing period, have limitations in terms of width-to-height ratios, and require expensive installation equipment, this method is not optimal.

Another method of positioning, applying and manipulating adhesive-backed gaskets, (or non-adhesive backed gaskets) or other similar materials, is disclosed in U.S. Ser. No. 08/215,124. As disclosed therein, a method and apparatus is presented for applying flexible gasket strips to a surface. More particularly, the invention of U.S. Pat. No. 5,536,342 relates to an automated system using a robot guided head to manufacture gasket patterns, and is particularly suitable for applying gasket strips to electronic circuit boards with a placement accuracy of about ±0.005". Typically, the gasket strips applied by the disclosed apparatus have a thickness dimension of from about 0.01" to about 0.125" and a width dimension of from about 0.04" to about 1". The gasket strips are applied in a manner which does not stretch or elongate the gasket strip material. Broadly, the apparatus directs a robot with a controller to apply the gasket strip to the substrate. The robot is then moved to advance a length of strip onto the substrate, the advancing strip being guided onto the substrate in the desired position. The controller actuates the cutting of the strip to the desired length. These steps can be repeated to apply additional strips as necessary to form the desired gasket pattern. Such a method and apparatus is extremely useful when material cost is at a premium, and where the material width is consistent throughout the application. However, since the method of die-cutting or molding offers distinct advantages when the desired patterns become very complex, or where material widths vary, a method to accurately and quickly apply these die-cut patterns is also quite valuable.

In addition to the foregoing, another shortcoming of the current methods for producing intricate patterns in various materials exists in the fabrication of such patterns with conventional dies. This shortcoming is consistent with many dimensioning procedures, such as but not limited to, die-cutting, forming, molding or slitting materials, for example, and manifests itself in the difficulty of removing the desired material from the die quickly, efficiently, and without damage to the dimensioned material. In many instances as well, the material to be cut, manipulated, and installed has a high-aspect ratio—meaning that the width of the material is substantially less than the height of the material in certain areas of the pattern. More particularly, EMI gaskets having a height of 0.100 inches (or more) and a width of 0.050 inches (or less) are often desired in many applications, such as but not limited to personal communication devices or PCMCIA applications. Such an aspect ratio of 2:1 is considered to be a high-aspect ratio. Presently, there are no known cost-effective procedures to produce, manipulate, position and effectively install such unstable-shaped articles, since these patterns do not readily release from their die, and are very difficult to handle without damaging. The foregoing difficulties are compounded when such articles are intricate, and comprised of a material that is soft, compliant, and susceptible to compression-set when over-compressed.

Over-compression is especially prevalent in the die-cutting industry, and is primarily a result of the large surface area of the inside cutting-edge walls of the die. In the case of forming high-aspect ratio shaped articles, conventional ejection material is located inside the die, and/or the die is necessarily deeper because of this high-aspect ratio. As is well known, for extremely resilient materials, such as foams, for example, high-aspect ratio die-cutting is not difficult, since these materials easily recover from over-compression, and the die doesn't have to be as deep, which reduces the inside die-wall surface area and makes part ejection easier. In addition to forming high-aspect ratio articles, even very low-aspect ratio articles (e.g., articles having an aspect ratio of about 1:8, and having dimensions of 0.010 inches high× 0.080 inches wide) currently have no cost-effective method for their manipulation and/or installation once fabricated, even though their ejection is less difficult during manufacture.

It should be understood, that similar shortcomings exist anywhere patterned materials are fabricated, dimensioned, positioned, manipulated and/or installed, such as but not limited to the field of molded environmental gaskets or formed metal foil covers.

The foregoing illustrates limitations known to exist in present processes for accurately dimensioning and manipulating materials. Thus, it is apparent that it would be advantageous to provide an improved process directed to overcoming one or more of the limitations set forth above. Accordingly, a suitable alternative is provided including features more fully disclosed hereinafter.

SUMMARY OF THE INVENTION

The present invention is directed to an apparatus and method for facilitating rapid and accurate fabrication, manipulation and installation of patterned materials. More particularly, the invention is defined by a multiplicity of core capabilities, each of which addresses a current need in the manufacturing industry. These capabilities include, but are not limited to, the following: the capability to die-cut a thin, blank swatch of material, manual removal of scrap portions, and manual manipulation of the die-cut material by utilizing a vacuum fixture; the capability to die-cut a thicker, high-aspect ratio pattern from a blank swatch, leave any scrap portions of the material intact, and manually manipulate the desired material pattern by utilizing a knife-edge vacuum fixture; the capability to die-cut a material through the use of a knife-edge vacuum die, which provides for automatic scrap-removal or desired-gasket extraction from the rest of the material, and manipulation/ejection/installation of the scrap or gasket; the capability to enhance the performance of the above through proper design of vacuum fixture features (i.e., blades, orifices, grooves, etc.); the capability to manipulate or install desired material patterns onto specialty parts through alterations in the design of the vacuum fixture; the capability to increase material utilization by nesting pattern cuts; and the use of positive air-pressure to assist in manipulating, without damaging, a patterned material.

In one embodiment of the present invention a method is provided for manipulating a patterned material for positioning on a surface. This method comprises the following steps:

providing a fixture having a manifold and a surface having at least one groove formed therein, the at least one groove fluidly communicating with the manifold and being shaped in a pattern corresponding to the pattern of the material;

connecting the manifold to a vacuum source;

providing a patterned material to be positioned on the surface;

placing the patterned material within the at least one groove;

fixedly locating the patterned material within the at least one groove by application of a vacuum;

precisely positioning the patterned material in a predetermined location on the surface; and ceasing the vacuum so that the vacuum fixture and patterned material may be separated from each other.

In another embodiment of the present invention, an apparatus is provided for manipulating a patterned material for positioning on a surface. The apparatus comprises a main body having a working surface, a manifold formed in a central portion of the main body, and at least one groove formed in the working surface. The at least one groove has a mirror image pattern compared to the patterned material. At least one aperture is formed in the at least one groove. The at least one aperture fluidly communicates with the manifold. A reversible gas flow means is provided for selectably supplying positive and negative gas pressure. The reversible gas flow means fluidly communicates with the manifold.

These and other embodiments of the present invention will be described in detail hereinafter.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings:

FIGS. 9 and 10 illustrate a process step in accordance with the teachings of the present invention;

FIGS. 12a and 12b are sectional views of die-cutting blades in accordance with the teachings of the present invention;

DETAILED DESCRIPTION OF THE INVENTION

Figure 1:
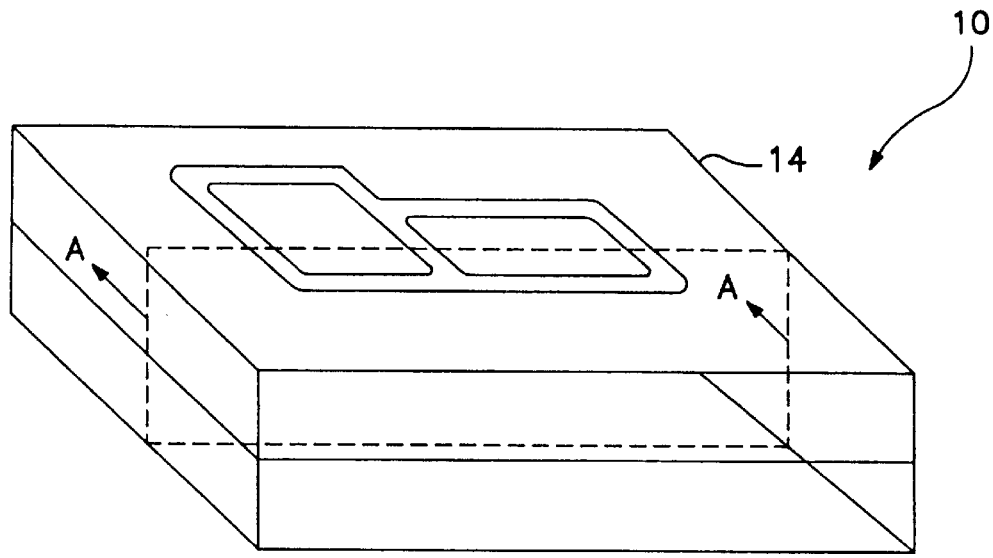
FIG. 1 is a perspective view of an embodiment of a vacuum fixture in accordance with the teachings of the present invention.

Referring now to the drawings, wherein similar reference characters designate corresponding parts throughout the several views, a vacuum fixture is illustrated generally at 10. The vacuum fixture 10 is operable to dimension, manipulate or install a patterned material 12, such as, but not limited to, molded, die-cut, or formed plastics, rubbers, cured adhesives, cured epoxies, metals, woven and non-woven materials, foils, cardboard, elastomers (e.g., silicones, polyurethanes, or neoprene), fluoropolymers (e.g., porous polytetrafluoroethylene copolymers of tetrafluoroethylene with hexofluoropropene, alkylvinyl ether ethylene and polyvinylidine fluoride or copolymers of vinylidene fluoride and hexofluoropropene), or tapes, for example. For illustration purposes only, and without having any intent of limiting the scope of the present invention, the methods and apparatus of the present invention are described in conjunction with a die-cut electrically conductive gasket patterned material 12. However, it is contemplated that the teachings of the present invention include a broad range of methods for dimensioning, manipulating or installing a patterned material, such as but not limited to dimensioning, manipulating or installing patterned materials through an injection molding process, for example. In such an embodiment of the present invention, the vacuum fixture 10 would function in part as a mold.

The electrically conductive gasket patterned material 12 may be an adhesively backed die-cut gasket comprised of a microporous expanded polytetrafluoroethylene (PTFE) material made in accordance with the teachings of U.S. Pat. Nos. 3,953,566; 4,187,390; 4,096,227; 3,962,153; 4,985,296 and 5,286,568, incorporated herein by reference. To render the microporous expanded polytetrafluoroethylene electrically conductive, the expanded PTFE may be filled with electrically conductive filler particles such as but not limited to silver, gold, nickel, stainless steels, plated forms of these, and the like or, preferably, high conductivity carbon particles. The electrically conductive gasket patterned material 12 may be loaded with conductive particles totaling from about 20% to about 60% by volume. Such an electrically conductive material may be purchased from W. L. Gore & Associates, Inc. of Newark, Del., under the tradename of GORE-SHIELD. This type of electrically conductive gasket material permits electric currents induced in the walls of a conductive electronic device to flow uninterrupted across a gasketed joint, (i.e., cover to case) or from a trace on a printed circuit board to a conductive shielding cover or electrical component.

An adhesive may be laminated to one or both sides of the electrically conductive gasket material in either film form from a roll or alternate methods. The adhesive surface is typically protected with a release-coated carrier sheet 17 until installation of the gasket. This release coating permits release of the gasket's adhesive when desired, and may be applied onto this carrier film by conventional coating technology, such as a film or solution coating, and is not described in detail herein.

Figure 13:
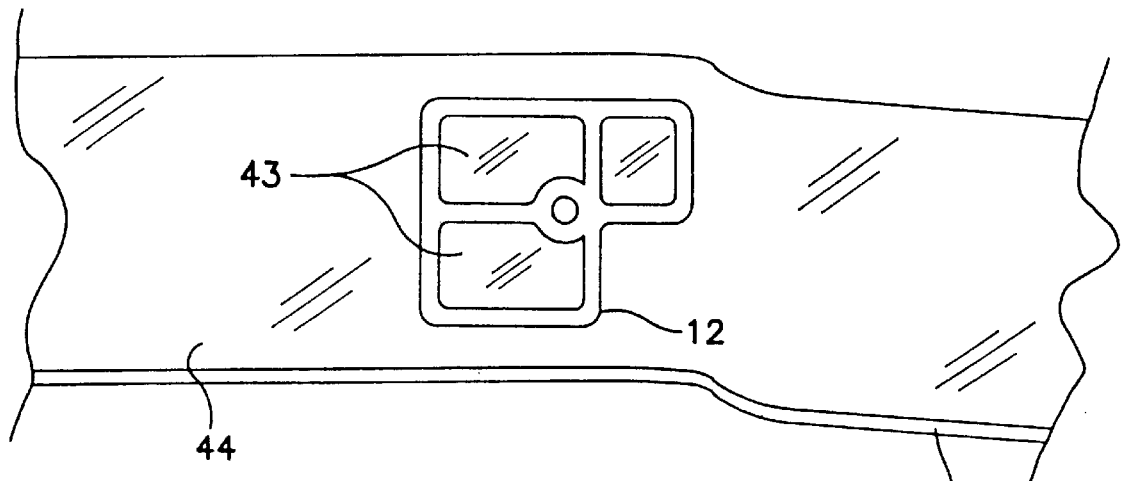
FIG. 13 is a top plan view of a typical material pattern that has been die-cut into a blank swatch of material.

The adhesive-backed patterned material 12 is also shown in FIG. 13, where it is illustrated still married to a carrier sheet 17, with its continuous external scrap 44, and discrete sections of internal scrap 43 also still intact.

The vacuum fixture 10 comprises a block 14 which forms the frame of the vacuum fixture. The block 14 may be made of any suitable material which may be easily machined. For example, if a metal block is required, aluminum is a suitable material. If a plastic block is required, a polymeric material, such as DELRIN® for example, is a suitable material. DELRIN is a registered trademark of the E.I. duPont de Nemours Company.

The block 14 may be comprised of two separate pieces, an upper piece 16 and a lower piece 18, which are integrally joined by any suitable method, such as threaded fasteners (not shown). A manifold 20 is formed in a central portion of the block 14. The manifold 20 forms a central area from which a vacuum is drawn. The manifold 20 is connected in fluid communication to a means for supplying a reversible gas flow 22, by way of a large orifice compression hose fitting 24. In one embodiment of the invention, the reversible gas flow means 22 is a high-flow venturi vacuum pump, and the hose fitting 24 preferably comprises a vacuum hose of at least ½" inner diameter. (A suitable venturi pump may be obtained from PIAB Company, Part# MLD 100.) It should be understood that mechanical or motor-driven vacuum pumps in various configurations may be used, as well, and that other size fittings will also function effectively.

In the upper block piece 16 are machined, or molded, grooves 26 which form an exact duplicate pattern of a material 12 to be either dimensioned, manipulated, or installed onto a desired substrate. It should be fully understood that the upper block piece 16 may contain multiple images of the desired pattern 12, which would enable several patterns to be manipulated at once. The depth of the grooves 26 will vary for different applications of the vacuum fixture 10. However, typically the grooves 26 will have a depth of about 75% of the uncompressed thickness of the material 12 to be dimensioned, manipulated, or installed. For example, for a patterned material 12 having a thickness of about 0.020 inches, the depth of grooves 26 should be about 0.015 inches.

Figure 3:
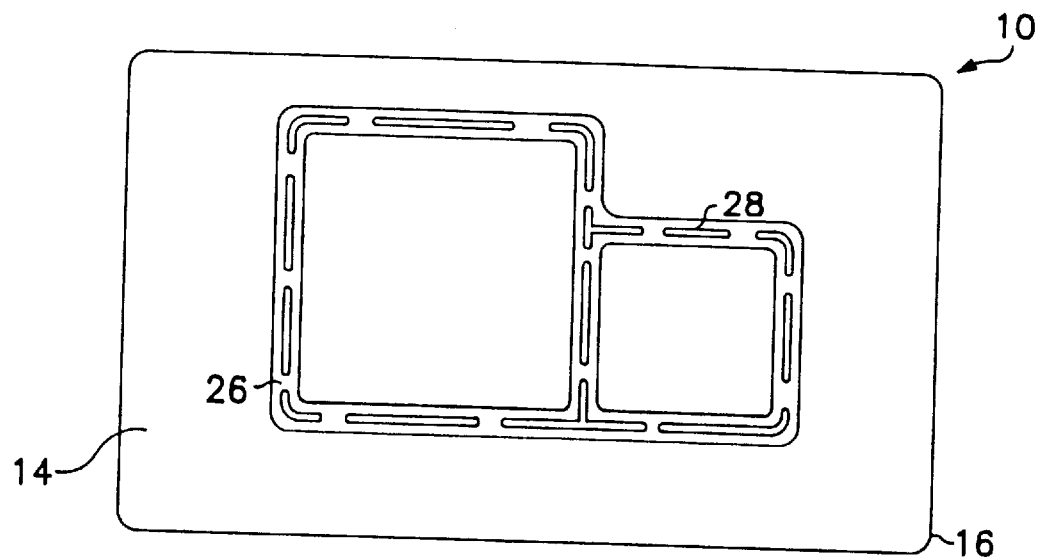
FIG. 3 is a top plan view of an embodiment of a vacuum fixture in accordance with the present invention.
Figure 4:
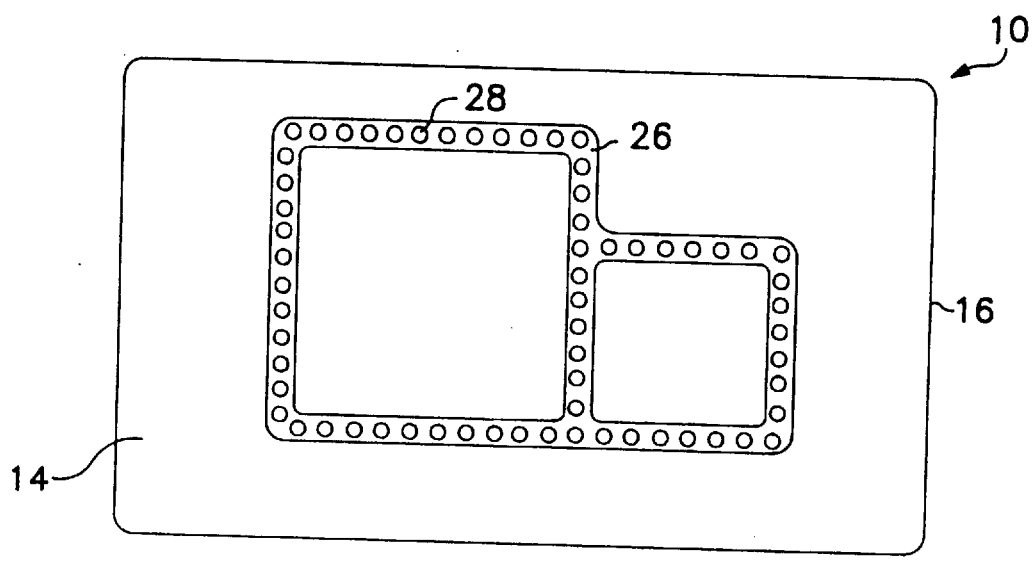
FIG. 4 is a top plan view of an embodiment of a vacuum fixture in accordance with the present invention.

At a bottom portion of the grooves 26 are apertures 28 which fluidly communicate with the manifold 20. The apertures 28 may be dimensioned to any suitable shape, such as for example elongated slots or circular apertures (FIGS. 3 and 4). As should be understood, greater vacuum force (negative air flow), and greater positive air flow is achieved as the size and number of apertures 28 increase. To avoid air leakage during use of the vacuum fixture 10, the grooves 26 should be dimensioned to mirror the cross-section of the patterned material to be dimensioned, manipulated or installed, and the apertures 28 preferably should be approximately 50% as wide as the width of the groove 26. The apertures 28 may be employed with positive air pressure to eject (or install) the patterned material to a predetermined substrate. This may be simply accomplished through the use of a manually actuated (or automatic) valve, placed strategically between the venturi-vacuum pump's air supply and vacuum output. This valving method may take several forms and is well-known in the industry.

The vacuum fixture 10 is operable to precisely manipulate, and to install, the patterned material 12 at an exact location on a substrate, e.g., a printed circuit board, or a housing cover. In the embodiment of the vacuum fixture 10 illustrated in FIG. 2, registration of a patterned material 12 is accomplished by suitably positioning the patterned material within the grooves 26. Confirmation of proper registration of the patterned material 12 is accurately accomplished by obtaining a positive physical feel that correct placement of the material in the fixture has been achieved. However, supplementary methods of confirming proper registration may also be used as well, such as but not limited to, dowel pins (which may be retractable) to mate with through-holes in a carrier sheet 17, or a flat edge to mate with an edge of the carrier sheet 17.

Figure 16:
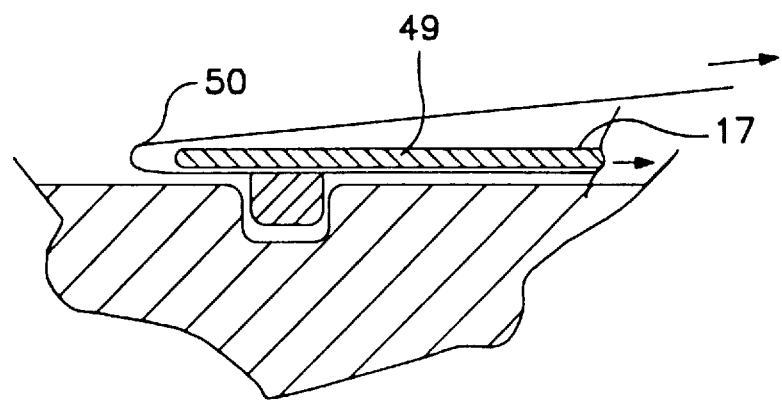
FIG. 16 is a method for peeling a carrier sheet from patterned material that reduces variability in the peeling process.

Once proper registration of the patterned material, or patterned gasket, 12 within the vacuum fixture 10 has been achieved, a vacuum is drawn. (A vacuum of >24 inches-Hg is preferred.) The vacuum is operable to hold the patterned material 12 firmly within the vacuum fixture 10. While the vacuum is being drawn, the carrier sheet 17 may be peeled away, exposing the gasket's adhesive layer. It is preferable that the carrier sheet 17 be peeled away at a sharp angle, i.e., less than 45 degrees, as shown in FIG. 9, since this will promote easy separation of the gasket's adhesive from the carrier sheet. Peeling the carrier as shown in FIG. 10 can sometimes cause the patterned gasket 12 to inadvertently pull out of the grooves 26 in one or more areas, which is an undesirable happening since it directly impacts installation accuracy. An improved method for peeling the carrier is shown in FIG. 16, which reveals the use of a peeling plate member 49 to assist in keeping the peeling angle to a minimum. The plate member 49 maintains slight downward pressure against the gasket pattern and fixture while it is pulled laterally away. At the same time, slack in the carrier sheet 17 is pulled in the same direction, keeping the carrier sheet taut against a front portion 50 of the plate member. This front portion 50 may take one of several forms (e.g., rounded, edged, shaped) all of which affect peeling tendencies.

After the carrier sheet 17 has been removed from the material 12, the vacuum fixture 10 is employed to install the patterned material onto a predetermined substrate, after which vacuum is released (or positive air-pressure is utilized), and the material 12 is permitted to be removed from the vacuum fixture 10 thereby terminating the installation.

As should be understood, registration of the substrate to the vacuum fixture 10 is critical, and this may simply take place via a set of dowel pins (and holes in the substrate—or vice-versa), clips, or by "eye" if extreme accuracy is not required. Such types of registration devices are well-known in the industry. If such dowel pins cause interference with the carrier sheet 17, retractable pins may be used, or even simpler, a punched hole or slot on the carrier sheet 17 may be used to provide clearance for the fixture pins. (Such holes or slots are preferred to be at least 2–3 diameters larger than the dowel pin itself.)

Figure 15:
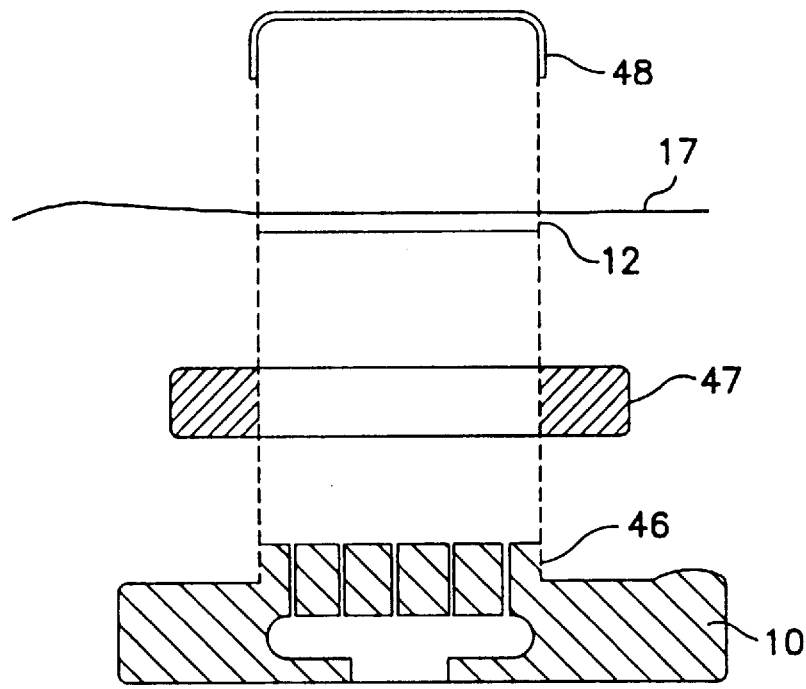
FIG. 15 is an alternate embodiment of the present invention that permits the installation of patterned materials into a recessed area.

FIG. 15 illustrates an alternate embodiment of the vacuum fixture of the present invention which facilitates manipulating a patterned material into a bottom of a can or cup-shaped article. The vacuum fixture 10 has an upwardly extending surface 46 having a height dimension which is greater than the depth of a recessed substrate 48 into which the patterned material is to be located and installed. A collar 47 is placed over the extending surface 46 such that it bottoms out on the vacuum fixture 10. The height of the collar 47 is manufactured to be greater than the height of the furface 46 by about 75% of desired gasket's thickness 12. In this manner, the gasket 12 may be properly registered into what appears to a user as a groove. Once proper vacuum is achieved on the pattern 12, the carrier sheet 17 may be peeled away as previously described, revealing the adhesive layer extending above the collar by about 25% of the gasket's thickness. The collar may then be removed or withdrawn (manually or automatically) from the upwardly extending surface 46 until it is clear of the fixture. The substrate 48 may then be positioned onto the surface 46 by utilizing the interior walls of the substrate 48 for registration with the outside walls of the surface 46. Once pressure is applied to the substrate 48 and vacuum to the fixture 10 is ceased, then the gasketed substrate may be removed from the fixture, and the installation is complete.

The pattern of material 12 may be formed on the carrier sheet 17 by any suitable method, such as by a die-cut process, a molding process, a dispensing process, or by robotically forming strips. If a die-cut process is to be employed, and an intricate pattern exists, a knife-edge type vacuum fixture of the type illustrated in FIGS. 5 and 6 may be employed. Such a vacuum fixture eliminates the tedious, costly and laborious process steps which have been employed heretofore to remove scrap material from the undesired die-cut areas of a patterned material.

Figure 2:
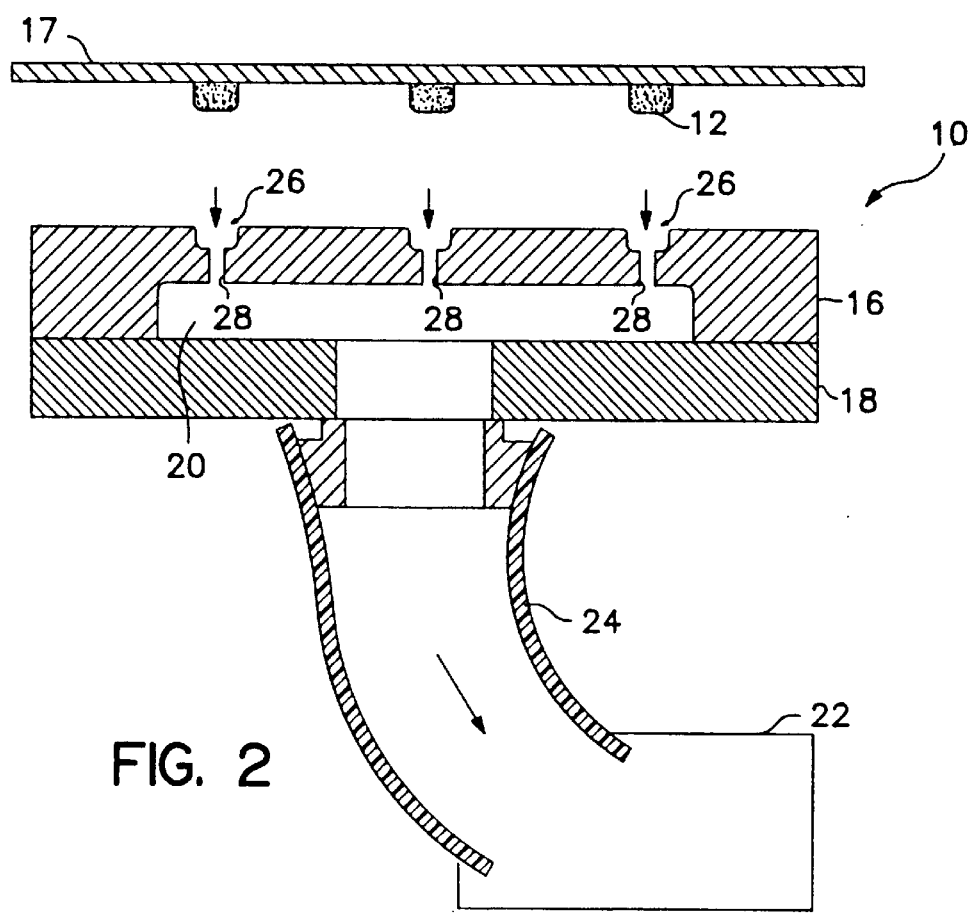
FIG. 2 is a sectional view of an embodiment of a vacuum fixture of the present invention which is disposed in fluid communication with a vacuum source.
Figure 5:
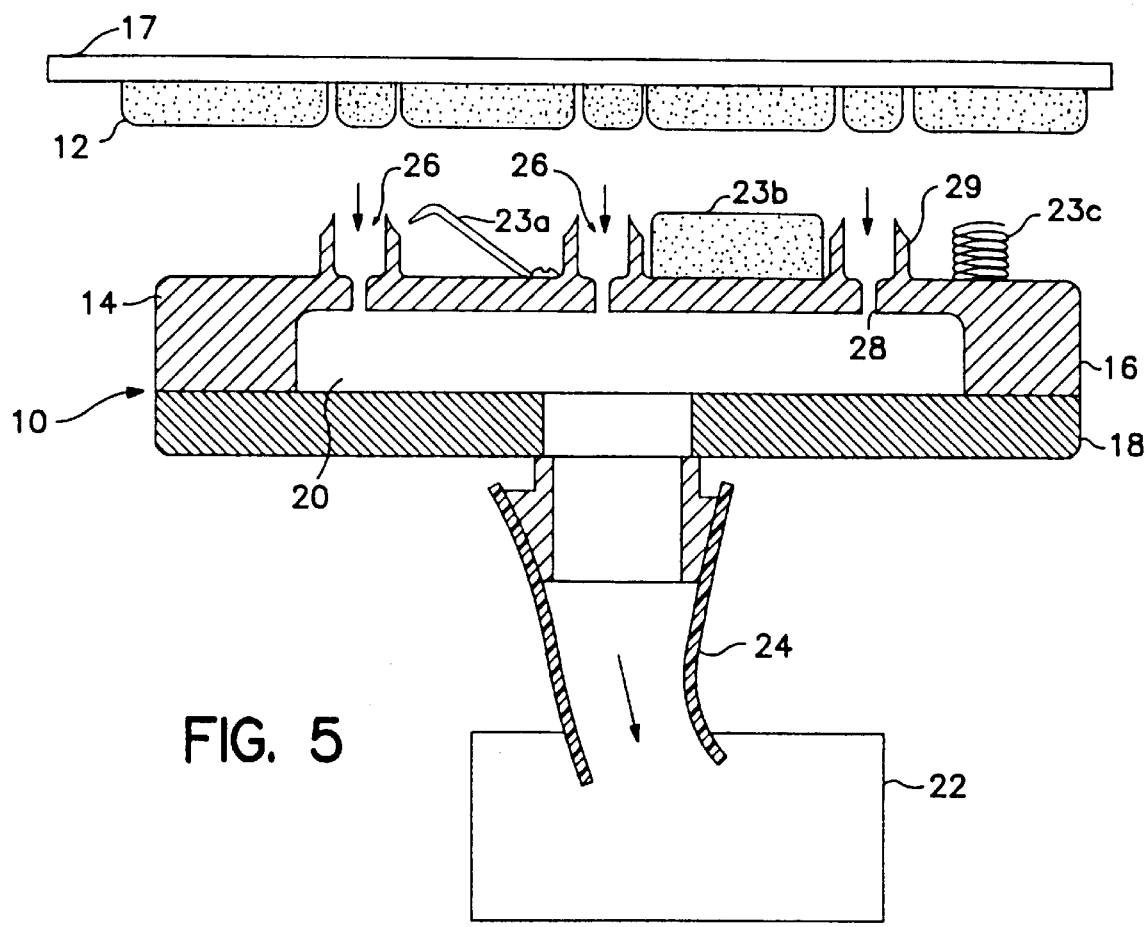
FIG. 5 is a sectional view of an embodiment of a vacuum fixture of the present invention which is disposed in fluid communication with a vacuum source.
Figure 6:
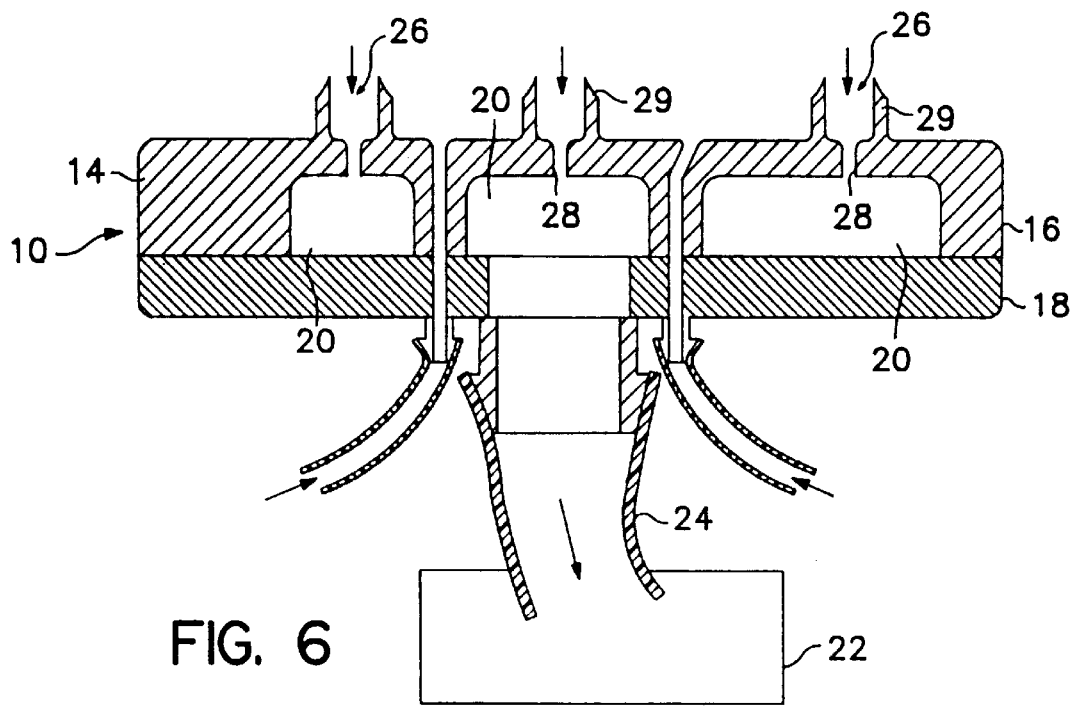
FIG. 6 is a sectional view of an embodiment of a vacuum fixture of the present invention which is disposed in fluid communication with a vacuum source.

As best seen by reference to FIGS. 5 and 6, the knife-edge type vacuum fixture comprises a similar design as illustrated in FIG. 2, except the knife-edge vacuum fixture utilizes a groove that is raised above the top surface of the fixture plate 16. This is accomplished by using thin, sharp walls 29 which surround the desired gasket pattern when it is properly registered with the vacuum fixture 10.

Once the patterned material 12 is die-cut, but without scrap yet removed, the carrier sheet 17 and die-cut patterned material are registered with the knife-edge type fixture 10. The walls 29 penetrate into the previously die-cut areas of the die-cut patterned material. Vacuum is only drawn in the areas where the desired gasket pattern lies. In undesired areas, (i.e., scrap areas) devices may be employed that persuade the gasket to remain with the carrier sheet 17 when the carrier sheet is peeled away. Such devices, include but are not limited to, spring clips 23a, foam material 23b, spring members 23c, or even low air pressure directed at the scrap. Preferrably, the spring clips 23a, foam material 23b, spring members 23c, or even low air pressure should be employed at the leading edge corner of the scrap being peeled away. As should be understood, if the leading edge corner of a scrap portion can be persuaded to remain with the peeled carrier sheet 17, then, typically, the remainder of the scrap portion usually will remain with the carrier 17 as well. Accordingly, when the carrier is peeled away, only the desired portion of the patterned material 12 will remain with the vacuum fixture 10, thereby eliminating a previously costly step of hand scrap removal, piece by piece. Leaving predetermined scrap portions with the patterned material 12 until the exact time of installation also serves to protect the patterned material 12 from damage or movement, which is especially important when manipulating high-aspect ratio gaskets.

In some cases, the knife-edge vacuum fixture 10 of FIGS. 5 and 6 may also be employed as a die-cutting apparatus. Such an embodiment of the present invention may be employed when it is desirable to initially form a patterned material 12 at the time of installation (or manipulation). When the knife-edge vacuum fixture 10 is used in such a manner, there is no need to register the patterned material 12 with the vacuum fixture 10, since the desired gasket pattern is not yet cut into the material. Registration, therefore, takes place at the exact time of gasket manufacture (i.e., die-cutting), so work-in-process of the finished patterned material is completely minimized. The die-cutting knife-edge vacuum fixture 10 is slightly different from the knife-edge vacuum fixture mentioned heretofore. The die-cutting knife-edge vacuum fixture is described in detail hereinafter.

In a die-cutting embodiment of a knife-edge vacuum fixture, the die-cutting thin walls 26 are preferably made from a wear-resistant metal, such as hardened steel for example. The die-cutting thin walls 26 must be extremely sharp and will be subjected to dulling conditions, e.g., when cutting through a material to be dimensioned. The depth of the grooves 26 should be approximately equal to the nominal thickness of the material to be dimensioned. This will prevent over-compression of the material to be dimensioned. (The depth of the grooves 26 is less critical with extremely resilient materials that do not exhibit a compression-set). Additionally, the scrap portions of the die-cutting knife-edge vacuum fixture 10 may be configured to assist in the separation of the scrap portions of the material 12 from the fixture. For example, the depth of the scrap portions of the die-cutting knife-edge vacuum fixture may be manufactured to approximately 75% of the nominal gasket thickness. This will cause the die-cutting knife-edge vacuum fixture to intentionally over-compress the scrap portions, which assists in the scrap removal process. (Over-compression results in better scrap gasket material adhesion to the carrier sheet 17, and over-compression lowers the scrap portion profile thereby reducing the tendency of the scrap portions to separate away from the carrier sheet 17 during the aforementioned peeling operations.)

It has been discovered that during use of the die-cutting knife-edge vacuum fixture 10, and depending upon the adhesive strength and other physical properties of a material, and the release characteristics of the carrier sheet 17, it is possible to eliminate completely the aforementioned peeling operation to separate the desired patterned material from unwanted scrap portions. It has been discovered that by withdrawing the die vertically from the material, with a vacuum being engaged with the desired patterned portion of the material, the patterned portion may be picked from the scrap portions. This picking of the patterned material is much quicker and more efficient than peeling. Also, this picking seems to be generally effective only in die-cutting. In addition to being a simpler operation, picking lends itself well to subsequent manipulation of the desired patterned material, since the desired patterned material is held firmly and registered accurately within the die-cutting knife-edge vacuum fixture, without human intervention.

If the patterned material is provided with an integral adhesive with a carrier sheet, several options exist for manipulating the patterned material post-die-cutting; these options depend on whether the underlying carrier sheet is not cut through by the knife-edge blades (hereafter called kiss-cutting, or kiss-cut), or whether the underlying carrier sheet is fully cut through (hereafter called blown-through).

If the carrier is blown-through, the picked patterned material will have a carrier sheet pattern still protecting the adhesive layer (since it is picked with the gasket pattern), and the assembly may be ejected directly into a shipping container. If the carrier sheet is kiss-cut and if the patterned material is provided with a layer of adhesive, the adhesive layer will be exposed, since the carrier sheet remains with the undesired scrap material upon withdrawal of the die-cutting knife-edge vacuum fixture. In such an event, a substrate, such as a printed circuit board or housing cover for example, may be subsequently positioned in an installation orientation with respect to the die-cutting knife-edge vacuum fixture, and the picked gasket may then be accurately air-ejected directly onto the predetermined substrate, thereby installing the patterned material.

It is also contemplated that the scrap portions may be alternatively picked, leaving the desired patterned material intact on the carrier sheet. If the scrap portions are then ejected into a scrap bin or other area, a method for eliminating any hand-labor previously associated with scrap removal has been achieved. The desired gaskets may be then left on the carrier sheet for shipment to an end user who has their own, standard vacuum fixture, such as the type illustrated in FIG. 1. This may be shown in FIG. 13 where the internal scap portions 43 may be picked from the carrier sheet 17, and the external scrap 44 removed in a continuous roll, leaving the desired pattern 12 in place on the carrier sheet.

In addition to the foregoing, and with respect to high-aspect ratio patterned materials, without ever utilizing a vacuum source, high-aspect ratio patterned materials may be die-cut and forcibly air-ejected from the knife-edge die back onto the carrier sheet, during the die-withdrawal process. This air-ejection is necessary because of the die's tendency to pick the thin-walled gasket partially from its scrap because of die-wall friction. Thus, an effective means for producing high-aspect ratio die-cuts has been established. These die-cut patterns (with scrap left intact to protect the unstable gasket) may be used by an end user with a suitably dimensioned knife-edge vacuum fixture.

Figure 7:
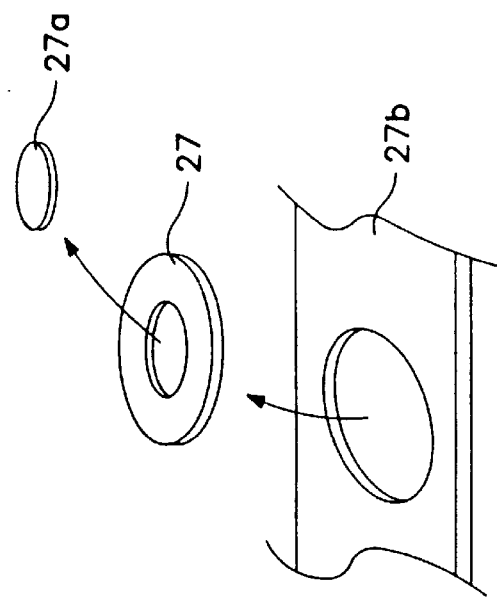
FIG. 7 is a perspective view of a die-cut washer, including internal and external scrap.

For operations involving patterned materials which are not provided with a layer of adhesive, other sorting or manipulation methods are appropriate due to the absence of the carrier sheet. For example, as best illustrated in FIG. 7, when die-cutting an annular washer 27, it may be desirable to pick the desired patterned portion from a respective scrap portion, and sort the internal scrap 27*a* and the external scrap 27*b* from the annular washer 27. Vacuum may or may not be required to keep the annular washer 27 within the die.

Figure 11:
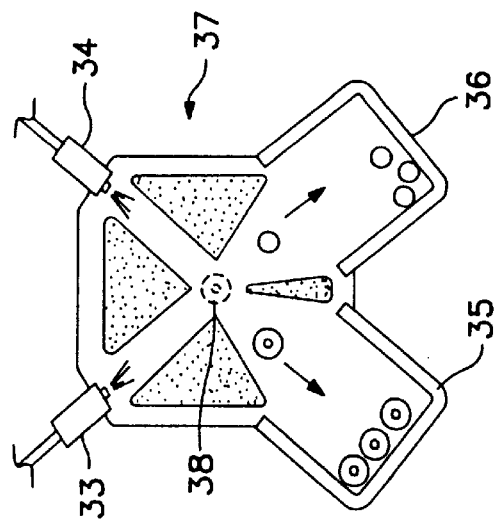
FIG. 11 is a top plan view of an air-ejection sorting apparatus, used in conjunction with the die-cutting apparatus shown in FIG. 8.
Figure 8:
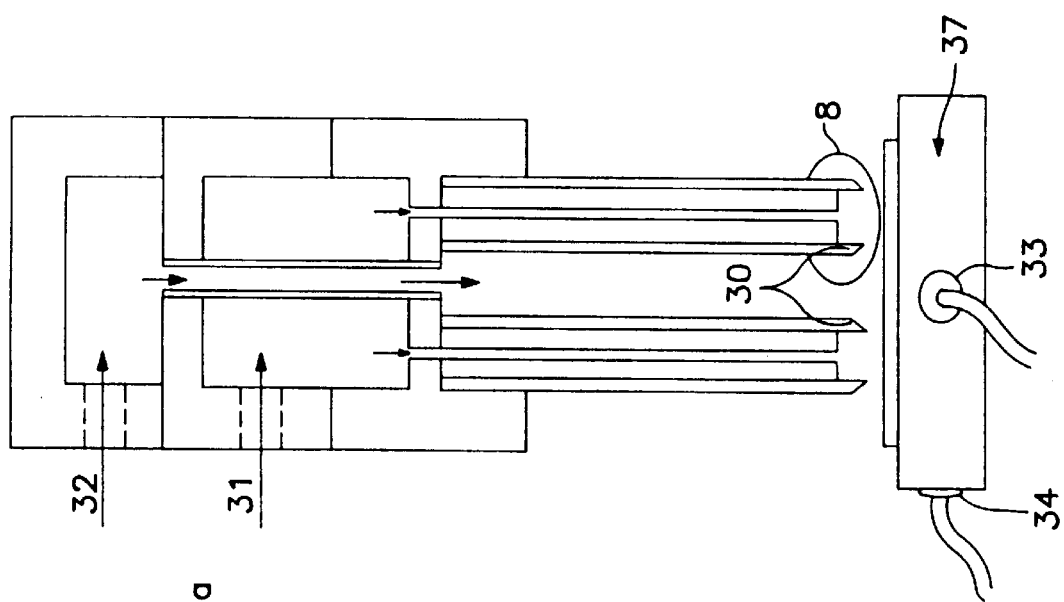
FIG. 8 is an embodiment of a high-aspect ratio die cutting apparatus in accordance with the teachings of the present invention.

As best illustrated in FIGS. 8 and 11, through separate air-ejection passages 31 and 32, the internal scrap 27*a* may be ejected first, followed by the desired portion 27. The external scrap 27*b* requires no ejection because it is external to the die. By employing such a sequence, an alternating pair of receptacles may be appropriately positioned under the die for sorting purposes. An alternate embodiment of the foregoing incorporates a pair of air nozzles 33 and 34 located perpendicular to the primary air-ejection stream. These can be activated alternately (in conjunction with the primary air-ejection means 31 and 32) in order to blow the desired part in a direction towards its appropriate receptacle 35 and 36 (FIG. 11). The guiding means for this sorting apparatus may be grooves machined into a base 37. The area on the base 37 where the die-cutting occurs is generally indicated at 38.

Figure 14:
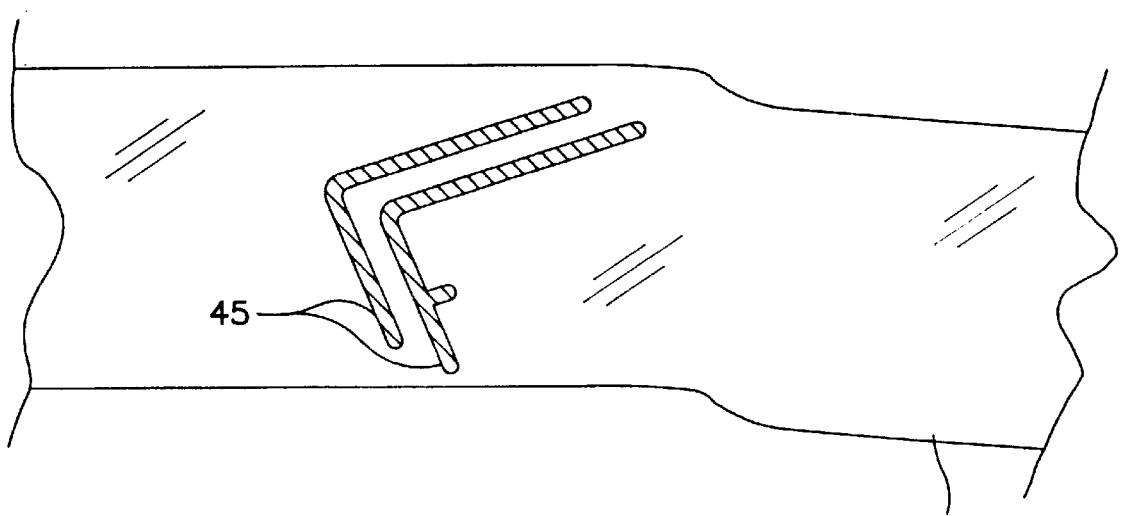
FIG. 14 is a top plan view of a typical nested material pattern that permits for better material utilization.

Also, it is contemplated that a desired pattern may be nested into several portions 45, as shown in FIG. 14, to increase material utilization. In the example illustrated in FIG. 14, once properly oriented, the nested portions 45 would form a simple rectangle. These separate parts may be air-ejected from a vacuum fixture, knife-edge vacuum die, or die-cut at different times as well, creating a cost-effective means for die-cutting materials that are more expensive in terms of cost per unit area.

As best illustrated by FIGS. 12*a* and 12*b*, several considerations exist when designing the cutting blades of a die-cutting knife-edge vacuum fixture. For example, the resiliency of the material to be die-cut and the manipulation intended to be performed must be considered. For example, if vacuum is to be used for precision placement (installation) of a material 40 that is susceptible to undesirable compression-set, a flush-bevel blade 39 might be utilized as shown in FIG. 12*a*. This will ensure that blade-wall friction is minimized, and therefore, over-compression of the gasket will not occur. However, if, as shown in FIG. 12*b*, it is desired that vacuum not be used, and/or if the material 42 to be die-cut is extremely resilient (or if over-compression is not an issue), a center bevel blade 41 might be employed. Typically, a Rockwell hardness minimum for all die-cutting blades described herein is about C45–C48, and these blades may be preferably made to be removable for sharpening/replacement as required in the application.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A method for dimensioning an electrically conductive gasket material, said method comprising the following steps:

providing a layer of electrically conductive gasket material having at least one layer of adhesive disposed on a surface thereof for securing said electrically conductive gasket material to an object of interest;

providing a fixture having a manifold and a working surface, the working surface fluidly communicating with the manifold;

providing a patterned cutting element on the working surface;

connecting the manifold to a reversible gas flow supply;

die-cutting the electrically conductive gasket material with the patterned cutting element; and while drawing a vacuum within the manifold, moving the fixture in a direction away from the electrically conductive gasket material to be dimensioned such that the die-cut patterned electrically conductive gasket material is separated from the layer of said electrically conductive material.

2. The method of claim 1, further comprising the step of removing said electrically conductive gasket material from within the patterned cutting element by supplying positive gas pressure to the manifold.

3. The method of claim 1, further comprising the step of removing said electrically conductive gasket material from a predetermined area on the working surface, outside of the patterned cutting element, by supplying positive gas pressure to the manifold.

4. The method of claim 1, further comprising the following steps:

providing on the working surface, outside of the patterned cutting element, at least one biasing element; and biasedly removing said electrically conductive gasket material from a predetermined area on the working surface, outside of the cutting element.

5. The method of claim 1, further comprising the following steps:

providing a release sheet covering the layer of adhesive of the electrically conductive gasket material; and die-cutting the electrically conductive gasket material with the patterned cutting element, while not cutting the release sheet.

* * * * *